US006844573B1

(12) United States Patent
Blish, II

(10) Patent No.: US 6,844,573 B1
(45) Date of Patent: Jan. 18, 2005

(54) STRUCTURE FOR MINIMIZING HOT SPOTS IN SOI DEVICE

(75) Inventor: Richard C. Blish, II, Saratoga, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 10/229,454

(22) Filed: Aug. 28, 2002

(51) Int. Cl.[7] .............................................. H01L 29/74
(52) U.S. Cl. .................. 257/173; 257/174; 257/359; 257/360; 257/363; 257/365; 257/355; 257/357; 257/358
(58) Field of Search ................................. 257/173, 174, 257/359, 360, 363, 365, 355, 357, 358, 356, 361, 362, 367, 350, 351, 500, 501, 507, 510, 203

(56) References Cited

U.S. PATENT DOCUMENTS

| 5,909,387 A | * | 6/1999 | Wong et al. ................... 365/45 |
| 6,569,742 B1 | * | 5/2003 | Taniguchi et al. ........... 438/303 |
| 2002/0063284 A1 | * | 5/2002 | Aono et al. .................. 257/344 |
| 2002/0195663 A1 | * | 12/2002 | Ramsbey et al. ............ 257/355 |
| 2003/0178648 A1 | * | 9/2003 | Bansal ........................ 257/202 |

* cited by examiner

Primary Examiner—Minhloan Tran
Assistant Examiner—Tan Tran

(57) ABSTRACT

In a high power input/output SOI semiconductor structure, the transistors thereof are laid out in a manner so that the high current density transistors, subject to the greatest heat buildup, are spaced apart in a manner as to avoid significant heat buildup.

11 Claims, 15 Drawing Sheets

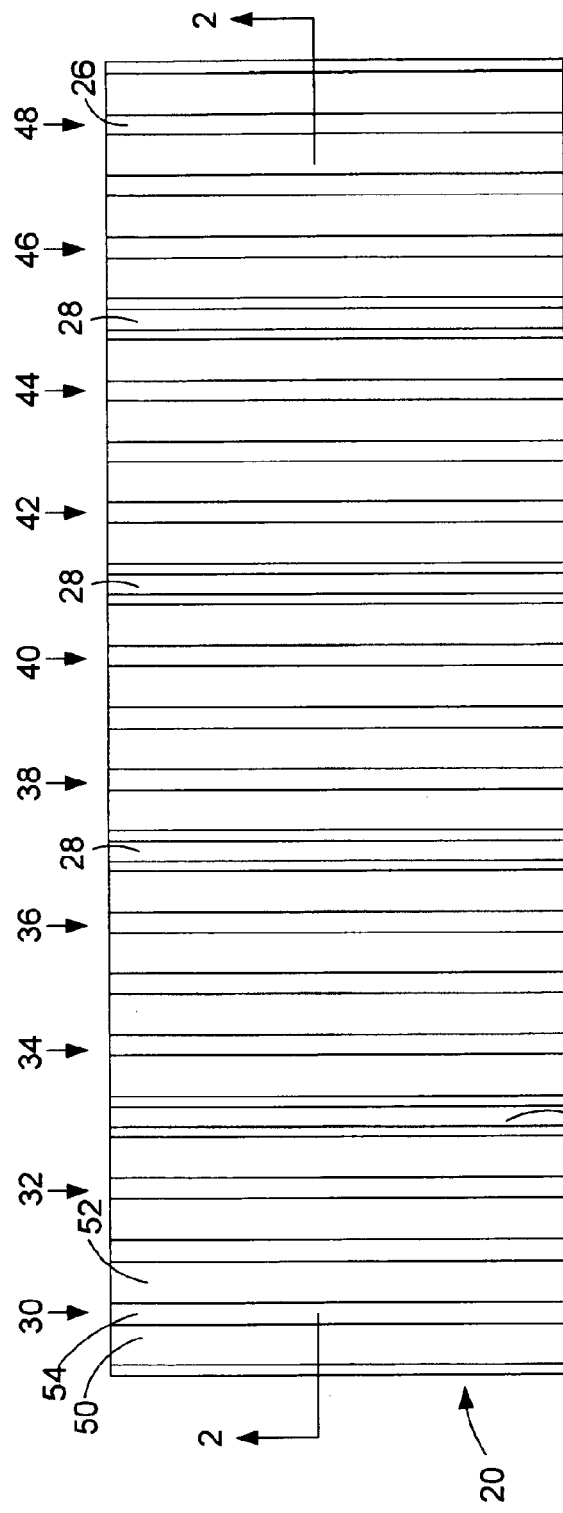
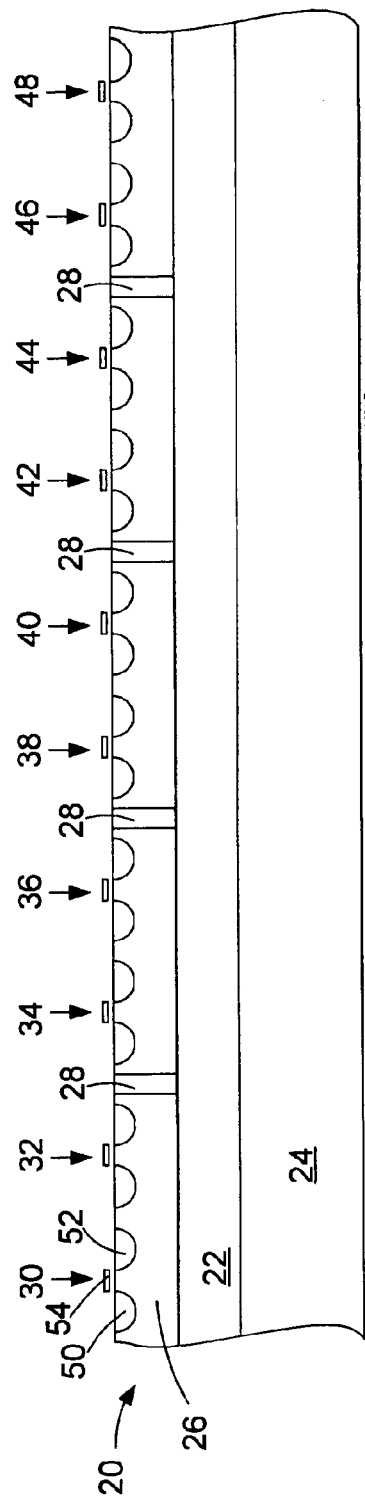
FIGURE 1 (PRIOR ART)
FIGURE 2 (PRIOR ART)

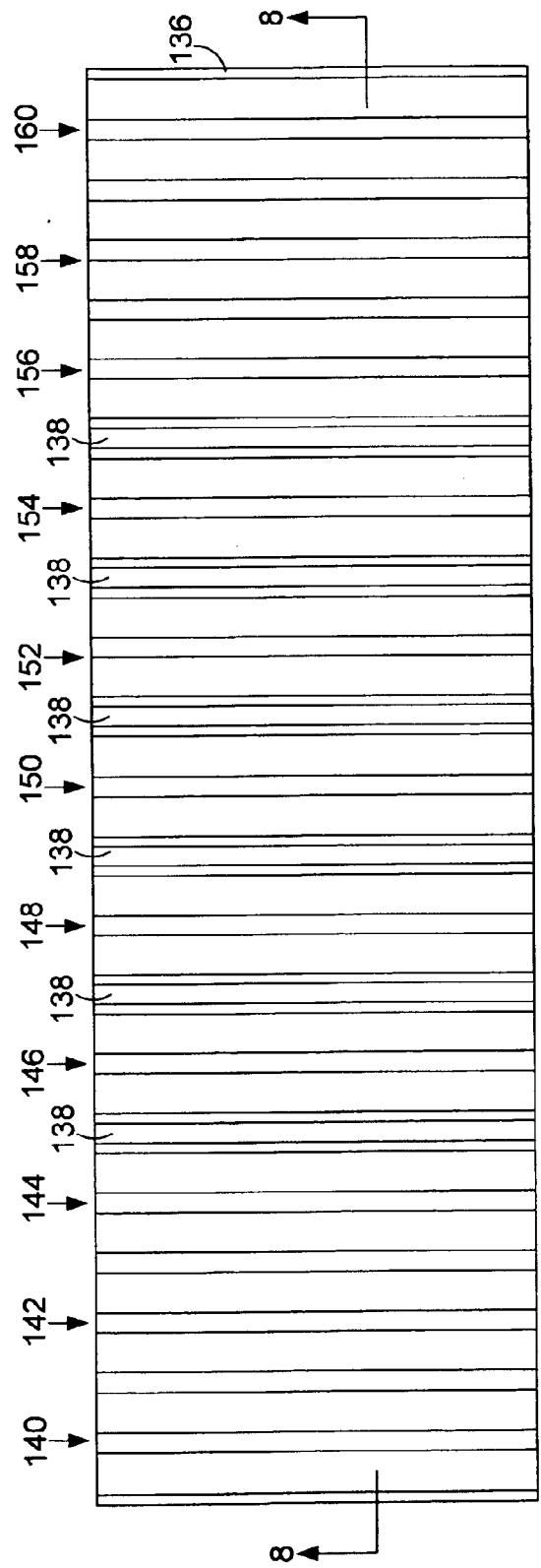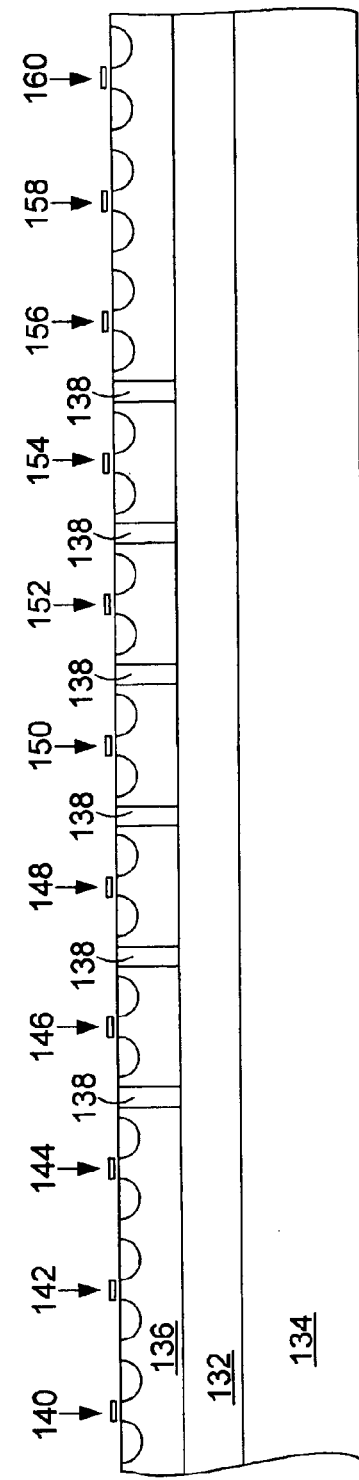

STRUCTURE FOR MINIMIZING HOT SPOTS IN SOI DEVICE

BACKGROUND OF THE INVENTION

1. Technical Field

This invention relates generally to semiconductor devices, and more particularly, to the configuration of high-power input/output semiconductor devices.

2. Background Art

FIGS. 1 and 2 illustrate a portion of a typical high-power input/output silicon-on-insulator (SOI) structure 20 of a semiconductor device, which structure communicates with core transistors on the same chip, and the input/output structures of one or more other chips. As is well known, the structure includes an oxide layer 22 on a silicon substrate 24, the oxide layer 22 having a silicon layer 26 thereon. Formed in the silicon layer 26, and properly isolated by silicon trench isolation oxide 28, are a number of large, elongated N channel and P channel transistors, in this typical embodiment (reading from left to right in FIGS. 1 and 2) electrostatic discharge, i.e., ESD-protection N channel transistors 30, 32, P channel transistor 34, P channel transistor 36, N channel transistor 38, N channel transistor 40, P channel transistor 42, P cannel transistor 44 (all operative input/output transistors), and ESD-protection N channel transistors 46, 48 in successive side-by-side, laterally spaced relation as shown, for which to the order is EE PP NN PP EE wherein E represents an ESD-protection N channel transistor, P represents a P channel transistor, and N represents a non-ESD-protection N channel transistor, for which the minimum periodicity for non-ESD-protection N channel transistors is 1, the minimum periodicity for P channel transistors is also 1, and the proportion of ESD-protection N channel transistors to the total number of transistors is 4/10.

Each transistor includes a source, a drain, and a gate above the transistor channel (for example transistor 30 includes source 50, drain 52 and gate 54). As is well-known, electron mobility is substantially greater in N channel transistors than hole mobility in P channel transistors. This results in substantially higher current (and substantially higher specific heat density) in an N channel transistor that in a P charnel transistor of similar size. Thus, typical designs provide greater "length" of P channel transistors to commute for the mobility difference.

While the advantages of an SOI device in semiconductor technology are well known (for example, maximizing speed, minimizing current leakage and capacitance and eliminating latchup problems), the high thermal impedance oxide layer 22 between the transistors 3048 and the silicon substrate 24 (from which heat is removed from the overall structure) can impede heat flow from the transistors to the substrate 24. While this is not a significant problem for the ES) protection N channel transistors 30, 32, 46, 48, which only operate for a very short period of time during a current spike, or the (lower current) P channel transistors 34, 36, 42, 44, the conventional, i.e., non ESD-protection N channel transistors 38, 40, grouped in successive adjacent relation as is shown in the typical structure of FIGS. 1 and 2, can cause significant heat buildup. This heat buildup can greatly increase current leakage and decrease mobility, degrading transistor performance, in extreme cases causing transistor failure.

Therefore, what is needed is a high-power input/output SOI semiconductor structure which includes transistors of various types laid out in a manner so as to avoid problems of heat buildup, taking advantage of silicon's (or other semiconductor material) high thermal conductivity and low spreading resistance.

DISCLOSURE OF THE INVENTION

The present invention is a high-power input/output SOI structure wherein the transistors are laid out in a manner so that high current density transistors are appropriately spaced apart so as to avoid significant heat buildup.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description win be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 1 is a plan view of a high-power semiconductor input/output structure of the prior art;

FIG. 2 is a sectional view taken along the line 2—2 of FIG. 1;

FIG. 7 is a plan view of a third embodiment of high-power semiconductor input/output structure in accordance with the present invention, FIG. 8 is a sectional view taken along the line 8—8 of FIG. 7;

BEST MODE(S) FOR CARRYING OUT THE INVENTION

Reference is now made in detail to specific embodiments of the present invention which illustrate the best mode presently contemplated by the inventors for practicing the invention.

Figure 3:
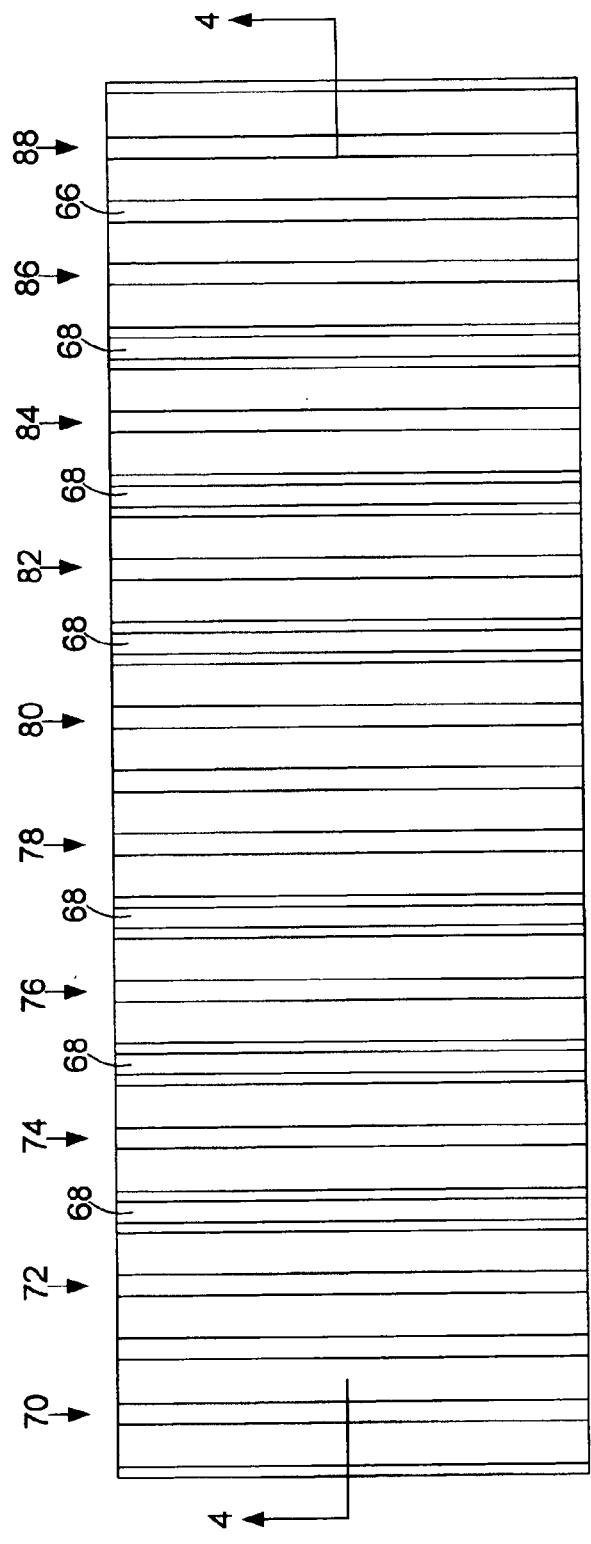
FIG. 3 is a plan view of a first embodiment of high-power semiconductor input/output structure in accordance with the present invention.
Figure 4:
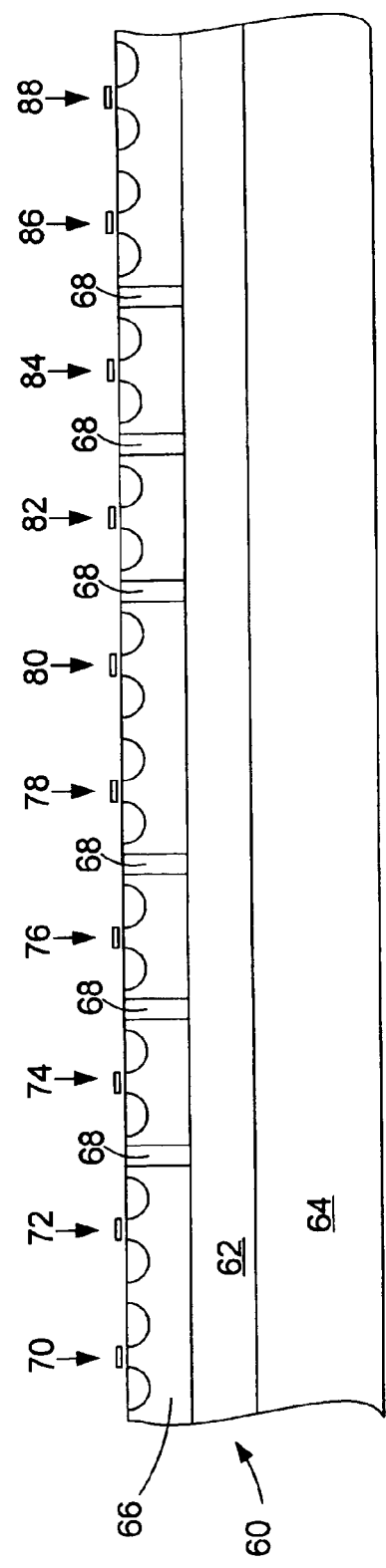
FIG. 4 is a sectional view taken along the line 4—4 of FIG. 3.
Figure 5:
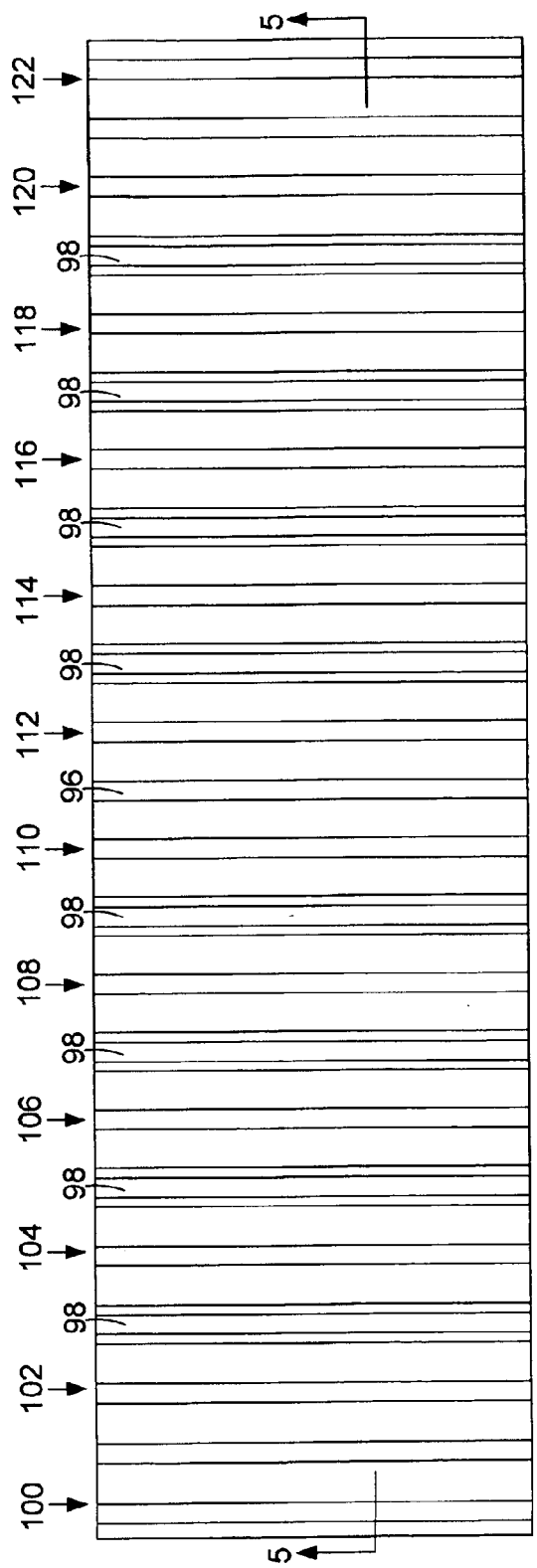
FIG. 5 is a plan view of a second embodiment of high-power semiconductor input/output struggle in accordance with the present invention.
Figure 6:
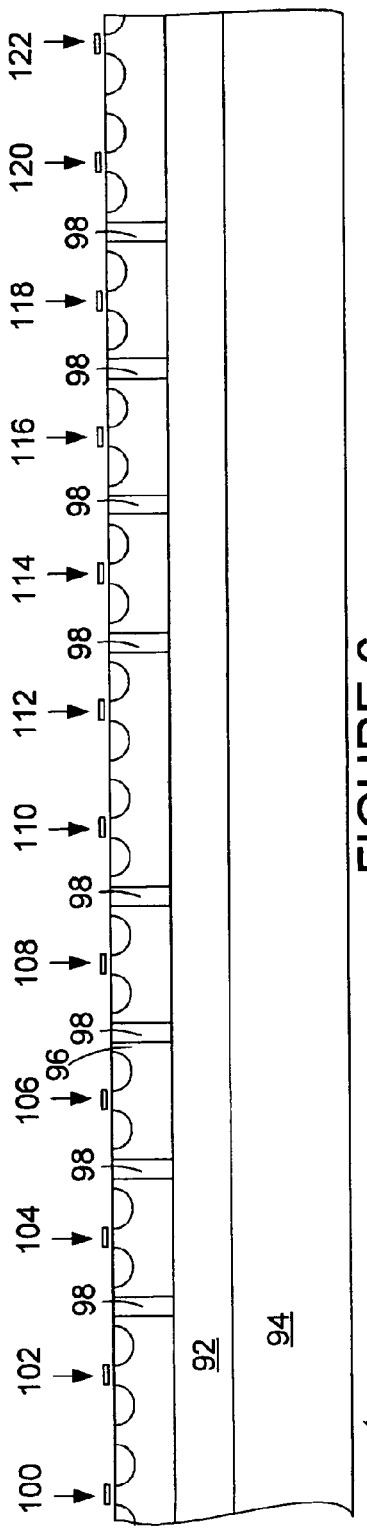
FIG. 6 is a sectional view taken along the line 6—6 of FIG. 5.

FIGS. 3 and 4 illustrate a high-power input/output SOI structure 60 of a semiconductor device in accordance with a first embodiment of the invention. The structure is 60 includes an oxide layer 62 on a silicon substrate 64, the oxide layer 62 having a silicon layer 66 thereon. Formed in the silicon layer 66, and properly isolated by shallow trench isolation oxide 68, are a number of large, elongated N channel and P channel transistors, in this embodiment (reading from left to right in FIGS. 3 and 4), ESD-protection N channel transistors 70, 72, P channel transistor 74, N channel transistor 76, P channel transistor 78, P channel transistor 80, N channel transistor 82, P channel transistor 84 (this group of transistors being operative input/output, i.e., non-ESD protection transistors), and ESD-protection N channel transistors 86, 88, in successive side-by-side, laterally spaced relation as shown, the order being EE P N PP N P EE, with the minimum non-ESD-protection N channel transistor periodicity being 3, the minimum P channel transistor periodicity being 1, and the proportion of ESD-portion N charnel transistors to the total number of transistors being 4/10. In this embodiment, the non-ESD-protection N channel transistors 76, 82, which were previously grouped in successive adjacent relation without any separation thereof as shown and described with regard to FIGS. 1 and 2, are now spaced apart by P channel transistors 78, 80, avoiding the problems of heat buildup as described above (it will be remembered that grouping together of P cannel transistors, with their lower current, or the grouping together of ESD-protection N channel transistors, with their intermittent and short time period operation, does not cause significant heat buildup problems). Thus, by positioning transistors as shown in FIGS. 3 and 4 and as described, the problems related to heat buildup in the structure 60 are avoided FIGS. 5 and 6 illustrate a high-power input/output SOI structure 90 of a semiconductor device in accordance with a second embodiment of the invention. Again, the structure 90 includes an oxide layer 92 on a silicon substrate 94, the oxide layer 92 having a silicon layer 96 thereon. Formed in the silicon layer 96, and properly isolated by silicon trench isolation oxide 98, are a number of large, elongated N channel and P channel transistors, in this embodiment (reading from left to right in FIGS. 5 and 6), ESD-protection N channel transistors 100, 102, P channel transistor 104, N channel transistor 106, P channel transistor 108 (all operative input/output, i.e., non-ESD protection transistors), ESD-protection N channel transistors 110, 112, P channel transistor 114, N channel transistor 116, P channel transistor 118 (all operative input/output, i.e., non-ESD protection transistors), and ESD-protection N channel transistors 120, 122, in successive side-by-side, laterally spaced relation as shown, for which the order is EE P N P EE P N P EE, which produces a minimum non-ESD-protection N channel transistor periodicity of 5 and a minimum P channel transistor periodicity of 2, while the proportion of ESD-protection N channel transistors to the total number of transistors is 6/12. Similar to the previous embodiment, the non-ESD-protection N channel transistors 106, 116, which were previously grouped in successive adjacent relation without any separation thereof as shown and described with regard to FIGS. 1 and 2, are now spaced apart by P channel transistors 108, 114 and ESD-pr on N channel transistors 110, 112, avoiding the problems of heat buildup as described above. Thus, by positioning transistors as shown in FIGS. 5 and 6 and described above, even further apart than in the embodiment of FIGS. 3 and 4, the problems related to heat buildup in the structure are avoided.

FIGS. 7 and 8 illustrate a high-power input/output SOI structure 130 of a semiconductor device in accordance with a third embodiment of the invention, which employs full interleaving of ESD-protection N channel transistors. Again, the structure 130 includes an oxide layer 132 on a silicon substrate 134, the oxide layer 132 having a silicon layer 136 thereon. Formed in the silicon layer 136, and properly isolated by silicon trench isolation oxide 138, are a number of large, elongated N channel and P channel transistors, in this embodiment (reading from left to right m FIGS. 3 and 4), ESD-protection N channel transistor 140, N cannel transistor 142, ESD-function N channel transistor 144, P channeled transistor 146, ESD-protection N channel transistor 148, P channel transistor 150, ESD-protection N channel transistor 152, P channel transistor 154, ESD-protection N channel transistor 156, N channel transistor 158 and ESD-protection N channel transistor 160, in successive side-by-side, laterally spaced relation as shown, so that the order is ENE P E P E P ENE, which produces a minimum non-ESD-protection N channel transistor periodically of 8, and a minimum P channel transistor periodicity of 2, while the proportion of ESD-protection transistors to total number of transistors is 5/11. The non-ESD-protection N channel transistors (in this embodiment transistors 142, 158) which were previously grouped in successive adjacent relation without any separation thereof as shown and described with regard to FIGS. 1 and 2, are now spaced apart by P channel transistors and ESD-protection N channel transistors. Indeed, each pair of non-ESD-protection N channel transistors is separated by a plurality of ESD-protection N channel transistors 144, 148, 152, 156 and P channel transistors 146, 150, 154, avoiding the problems of heat buildup as described above. Thus, by positioning transistors as shown in FIGS. 5 and 6 and described above, even further apart than in the embodiment of FIGS. 3 and 4 and the embodiment of FIGS. 5 and 6, the problems related to heat buildup in the structure are avoided.

Figure 9:
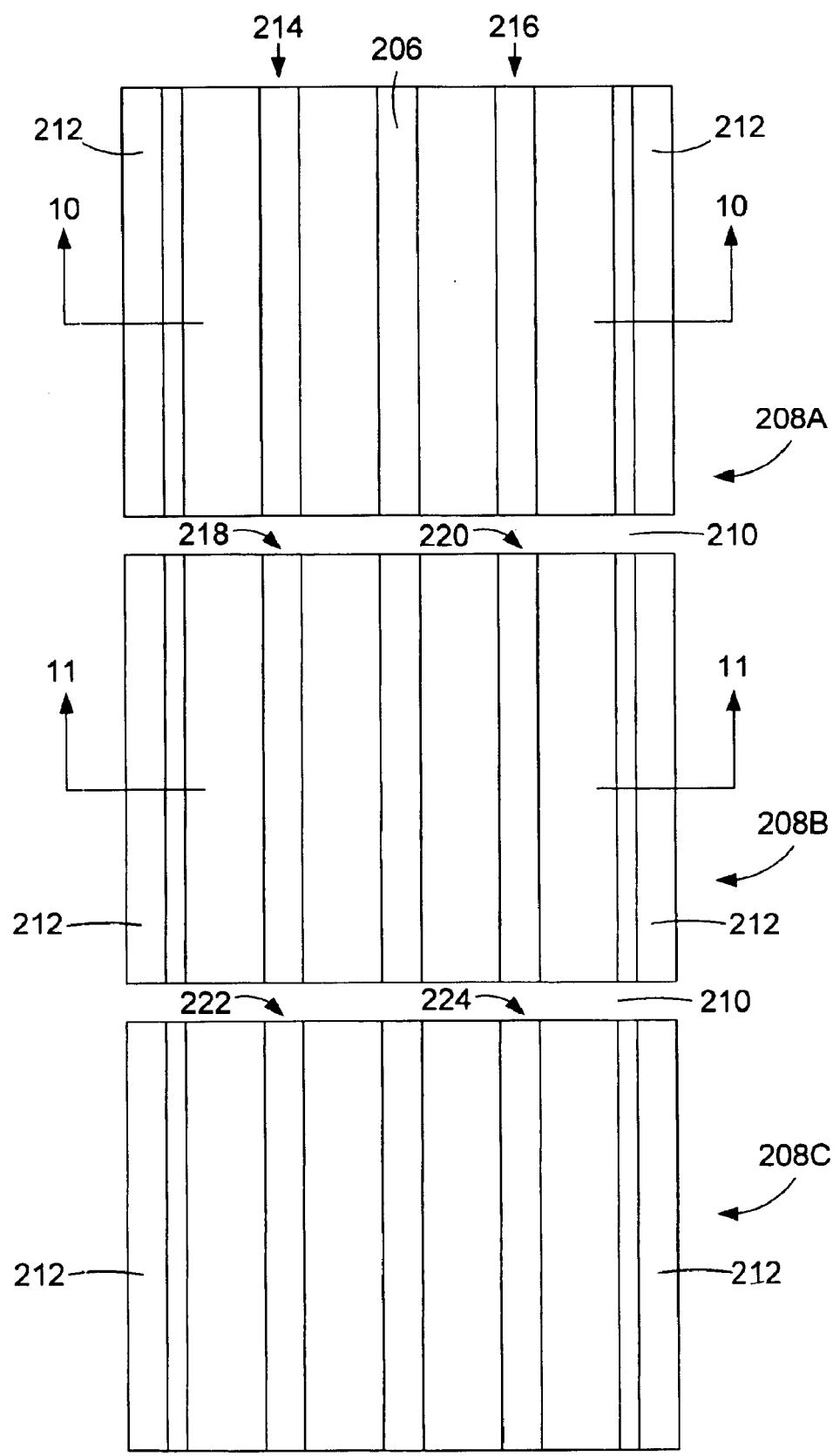
FIG. 9 is a plan view of a fourth embodiment of high-power semiconductor input/output structure in accordance with the present invention.
Figure 10:
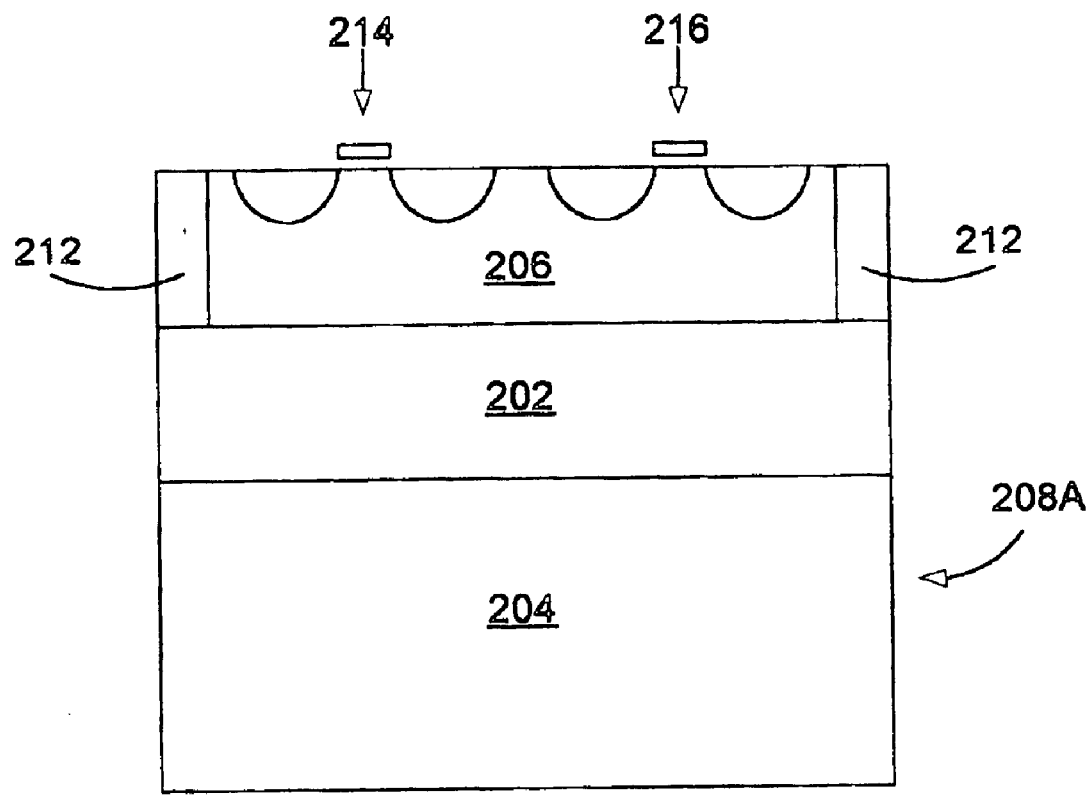
FIG. 10 is a sectional view taken along the line 10—10 of FIG. 9.
Figure 11:
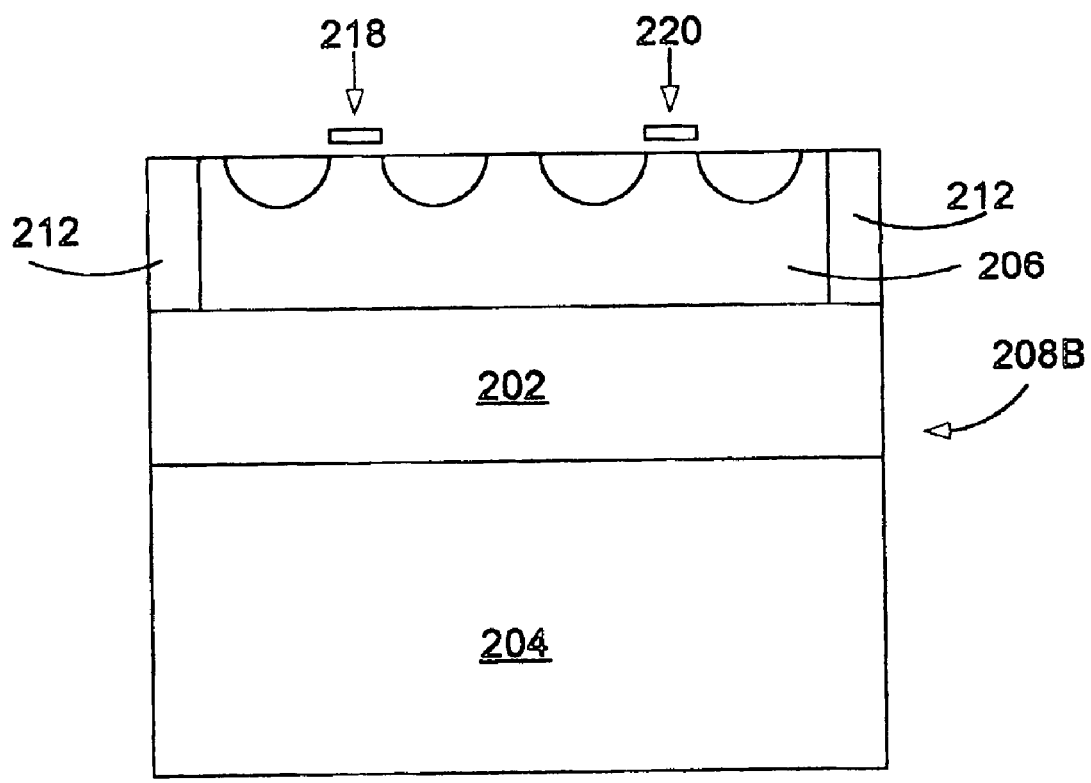
FIG. 11 is a sectional view taken along the line 11—11 of FIG. 9.

FIGS. 9–11 illustrate a high-power input/output SOI structure 200 of a semiconductor device in accordance with a fourth embodiment of the invention. Again, the structure 200 includes an oxide layer 202 on a silicon substrate 204, the oxide layer 202 having a silicon layer 206 thereon. The structure 200 is made up of a plurality of segments successive 208A, 208B, 208C, . . . , separated by silicon trench isolation oxide 210 (it will be understood that while FIGS. 9–11 show only three segments, the number of such segments can be chosen as desired).

With regard to the segment 208A, formed in the silicon layer 206, and properly isolated by silicon trench isolation oxide 212, are non-ESD-protection N channel transistors 214, 216 (NN). These transistors 214, 216 are in successive, laterally spaced relation as shown. With regard to the segment 208B, formed in the silicon layer 206, properly isolated by silicon trench isolation oxide 212, are ESD-protection N channel transistors 218, 220 (EE). These transistors 218, 220 are again in successive side-by-side, laterally spaced relation. As will be seen in FIG. 9, the transistors 214, 218 are adjacent and substantially aligned, while the transistors 216, 220 are adjacent and substantially aligned, The segment 208C is a repeat of the segment 208A (NN), having formed in the silicon layer 206, and properly isolated by silicon trench isolation oxide 212, N channel transistors 222, 224 in successive side-by-side, laterally spaced relation. The transistors 218, 222 are adjacent and substantially aligned, while the transistors 220, 224 are adjacent and substantially aligned. While additional segments are not shown, it will be understood that the sent immediately below the sent 208C would be a repeat of the segment 208B. This series of alternating segments can be (vertically) chirp as desired. In this embodiment, a given pair of non-ESD-protection N channel transistor segments, i.e., for example, segments 208A, 208C, is separated by a segment containing only ESD-protection N channel transistors (segment 209B). Thus, heat buildup along the active length of N charnel transistors is avoided.

Figure 12:
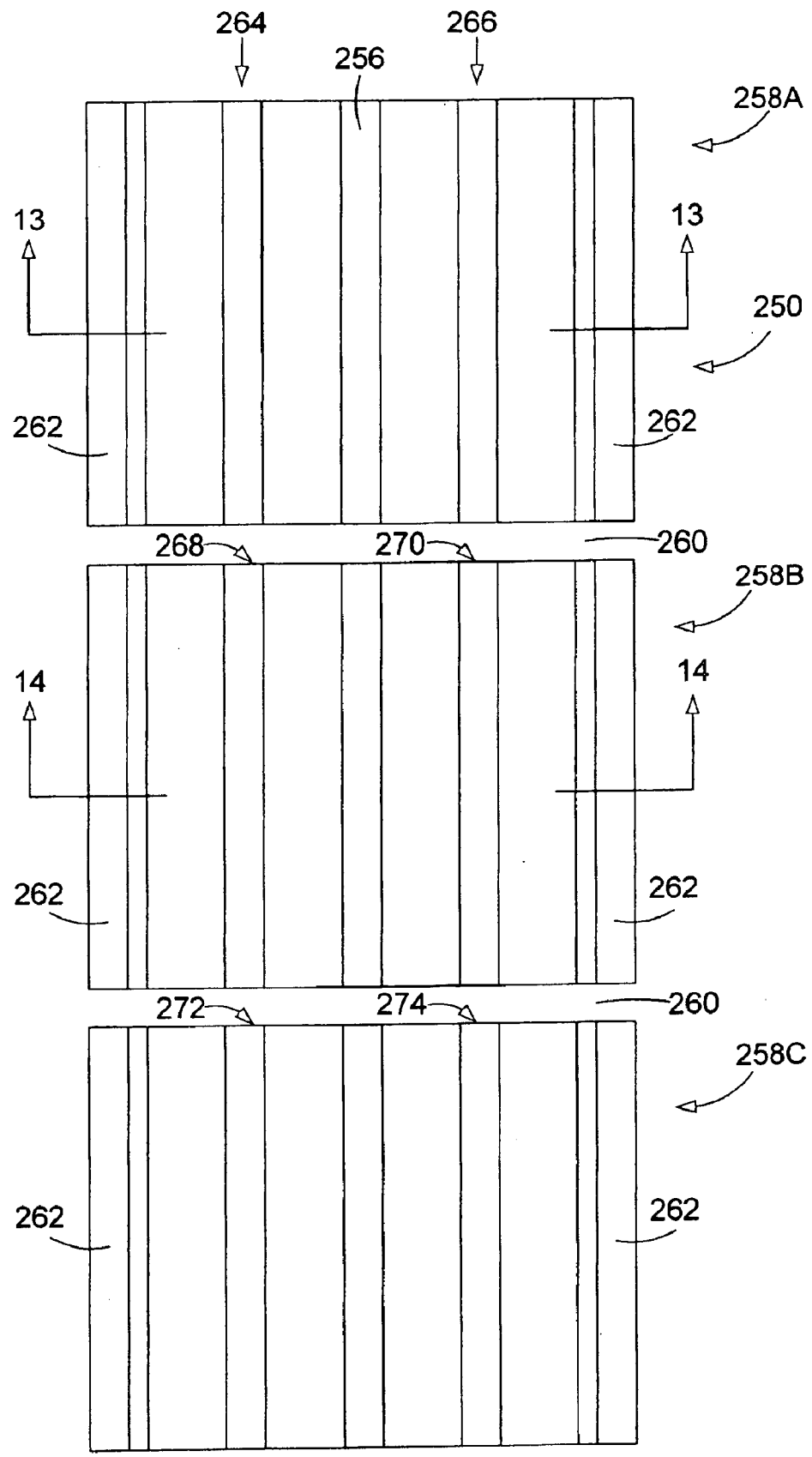
FIG. 12 is a plan view of a fifth embodiment of high-power semiconductor input/output structure in accordance with the present invention.
Figure 13:
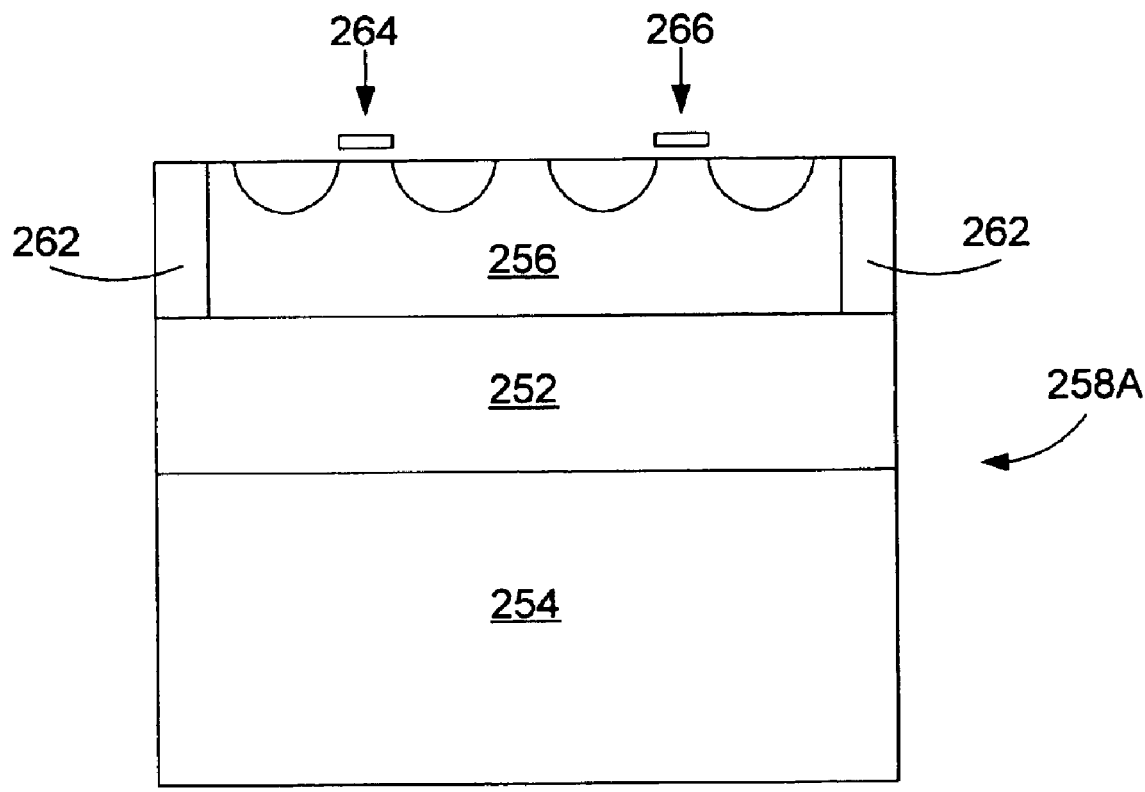
FIG. 13 is a sectional view taken along the line 13—13 of FIG. 12.
Figure 14:
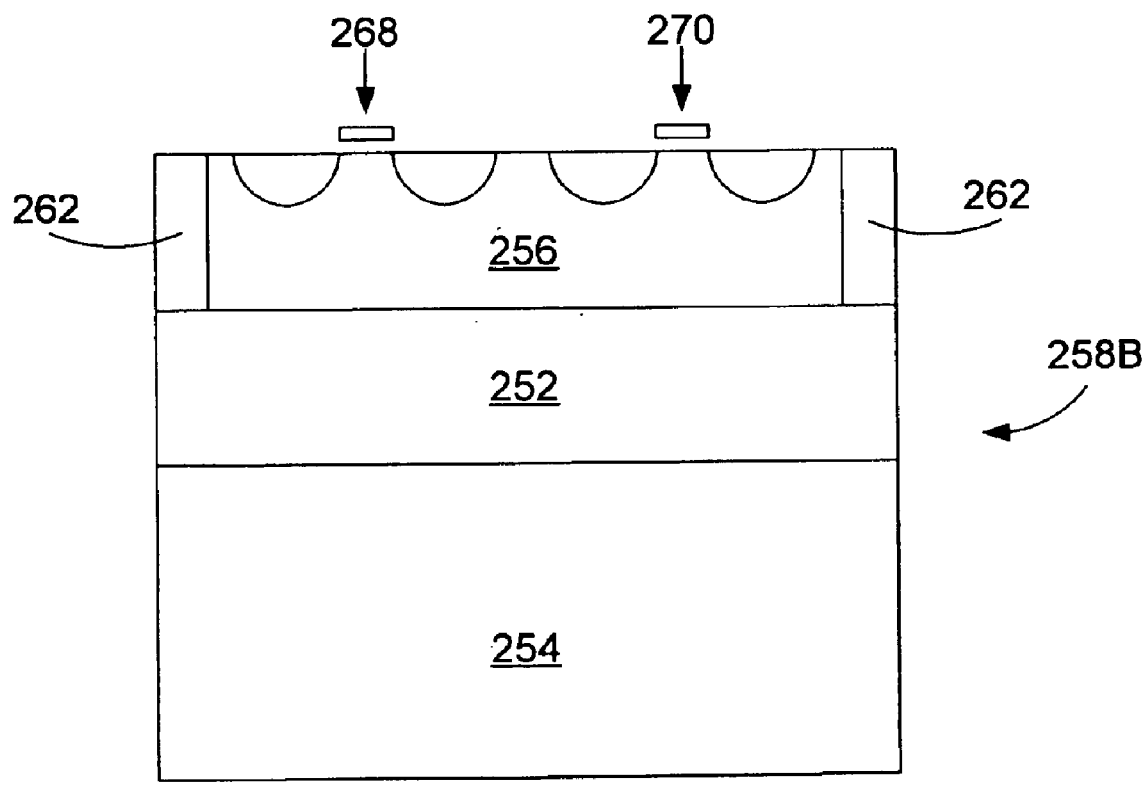
FIG. 14 is a sectional view taken along the line 14—14 of FIG. 12.

FIGS. 12–14 illustrate a high-power input/output SOI structure 250 of a semiconductor device in accordance with a fifth embodiment of the invention. Again the structure 250 includes an oxide layer 252 an a silicon substrate 254, the oxide layer 252 having a silicon layer 256 thereon. The structure 250 is made up of a plurality of successive segments 258A, 258B, 258C, . . . , separated by silicon trench isolation oxide 260.

With regard to the segment 258A, formed in the silicon layer 256, and properly isolated by silicon trench isolation oxide 262, are N channel transistors 264, 266 (NN). These transistors 264, 266 are in successive side-by-side, laterally spaced relation as shown. With regard to the segment 258B, formed in the silicon layer 256, and properly isolated by silicon trench isolation oxide 262, are P channel transistors 268, 270. These transistors 268, 270 (PP) are again in successive side-by-side, laterally spaced relation. As will be seen, the transistors 264, 268 are adjacent and substantially aligned, while the transistors 266, 270 are adjacent and substantially aligned. The segment 258C is a repeat of the segment 258A (NN), having formed in the silicon layer to 56, properly isolated by silicon trench isolation oxide 262, N channel transistors 272, 274 in successive side-by-side, laterally spaced relation. The transistors 268, 272 are adjacent and substantially aligned, while the transistors 270, 274 are adjacent and substantially aligned, While additional segments are not shown, it will be understood that the segment immediately below the segment 258C would be a repeat of the segment 258B. This series of alternating segments can be continued (vertically) as desired. In this embodiment, each pair of segments containing side-by-side non-ESD N channel transistors (for example segments 258A, 258C) is separated by a segment only P channel transistors (258C). Thus, heat buildup along the active length of the N channel transistors is avoided.

Figure 15:
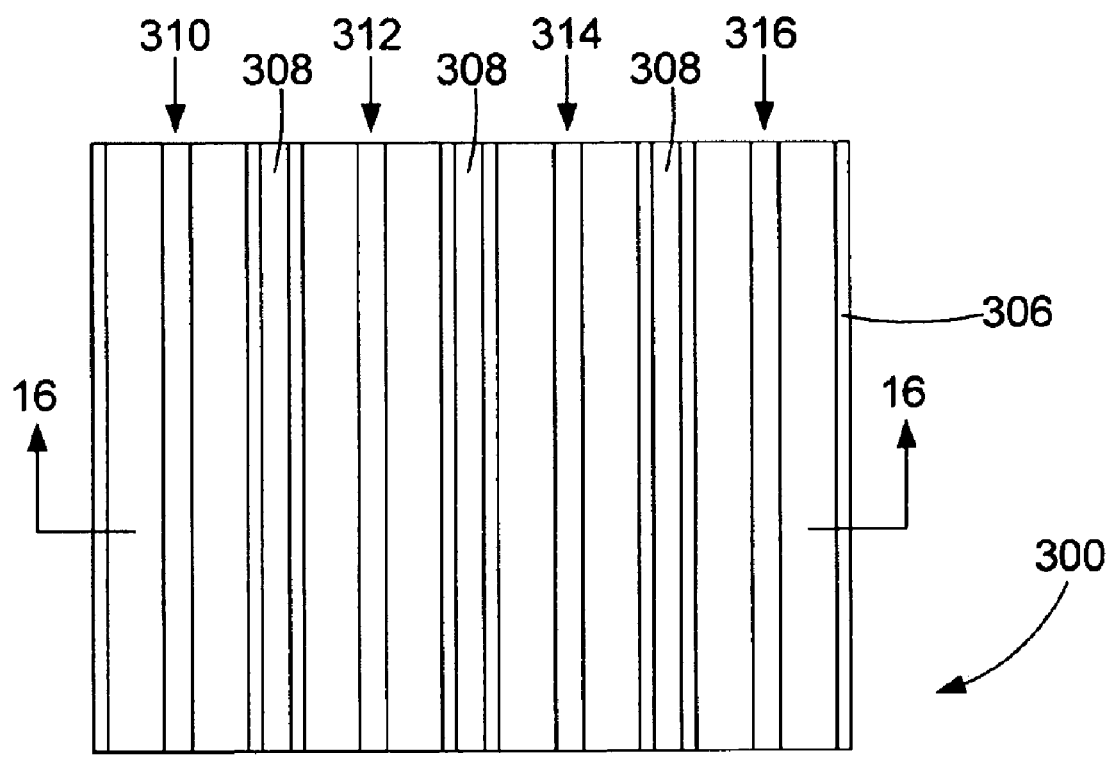
FIG. 15 is a plan view of a sixth embodiment of high-power semiconductor input/output structure in accordance with the present invention.
Figure 16:
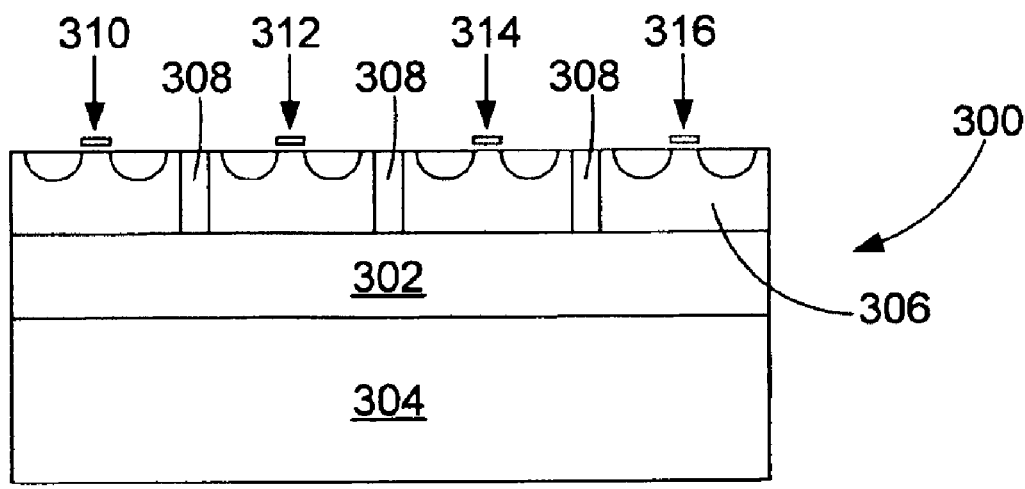
FIG. 16 is a sectional view taken along the line 16—16 of FIG. 15.

FIGS. 15 and 16 show a high-powered semiconductor input/output SOI structure 300 in accordance with the present invention. Again, the structure 300 includes an oxide layer 302 on a silicon substrate 304, the oxide layer 302 having a silicon layer 306 thereon. Formed in the silicon layer 306, and properly isolated by silicon trench isolation oxide 308, are (reading from left to right) P cannel transistor 310, ESD-protection N cannel transistor 312, P cannel transistor 314, and ESD-protection N channel transistor 316. These transistors 310–316 are in successive side-by-side, laterally spaced relation as shown (PEPE).

Figure 17:
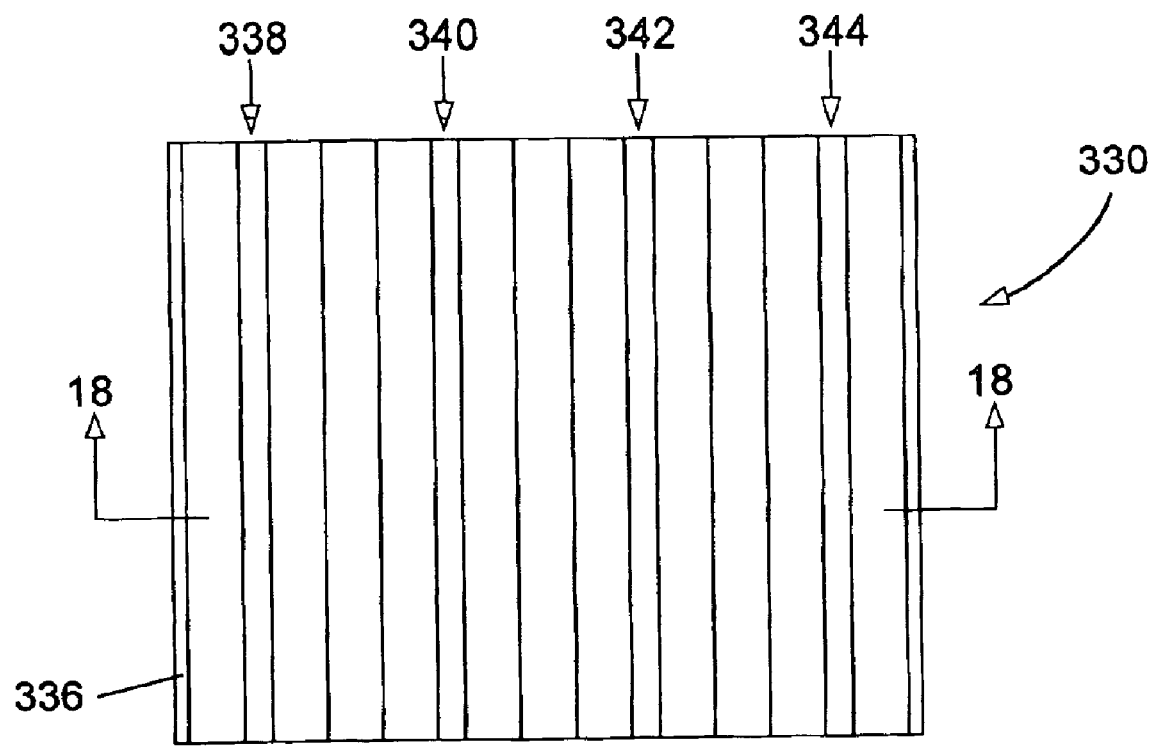
FIG. 17 is a plan view of a seventh embodiment of high-power semiconductor input/output structure in accordance with the present invention.
Figure 18:
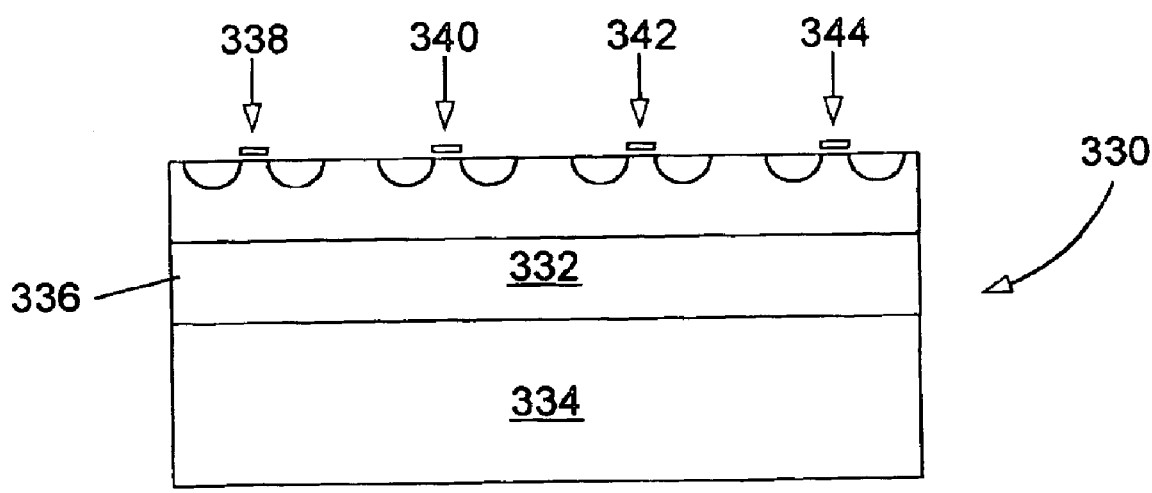
FIG. 18 is a sectional view taken along the line 18—18 of FIG. 17.

FIGS. 17 and 18 show another high-power semiconductor input/output SOI structure 330 in accordance with the present invention. Again, the structure 330 includes an oxide layer 332 on a silicon substrate 334, the oxide layer 332 having a silicon layer 336 thereon. Formed in the silicon layer 336 are (reading from left to right) ESD-protection N channel transistor 338, N channel transistor 340, ESD-protection N channel transistor 342, and N Channel transistor 344. These transistors 339–344 are in successive side-by-side, laterally spaced relation as shown (ENEN).

Figure 19:
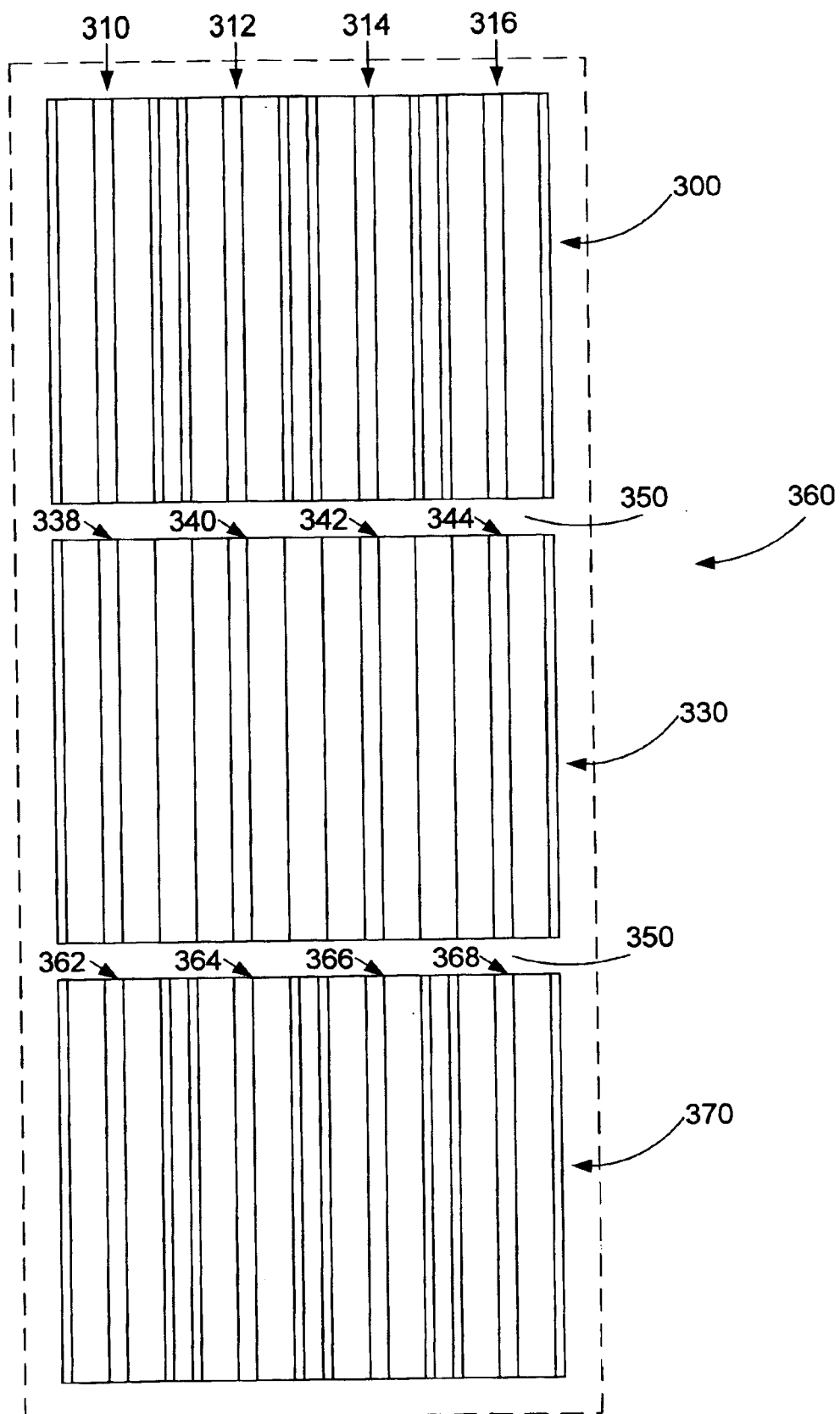
FIG. 19 is a plan view illustrating a first cell of the present invention

FIG. 19 shows a cell 360 made up of the structures of FIGS. 15–18. In this cell 360, the structure 300 and the structure 330 immediately therebelow are separated by silicon trench isolation oxide 350 and are positioned so that transistors 310, 338 are adjacent and sub ally aligned, transistors 312, 340 are adjacent and substantially aligned, transistors 314, 342 are adjacent and substantially aligned, and transistors 316, 344 are adjacent and substantially aligned. The structure 370 immediately below the structure 330 is a repeat of the structure 300, separated from the structure 330 by silicon trench isolation oxide 350, so that transistors 338, 362 are adjacent and substantially aligned, transistors 340, 364 are adjacent and substantially aligned, transistors 342, 366 are adjacent and substantially aligned, and transistors 344, 368 are adjacent and substantially aligned.

Figure 20:
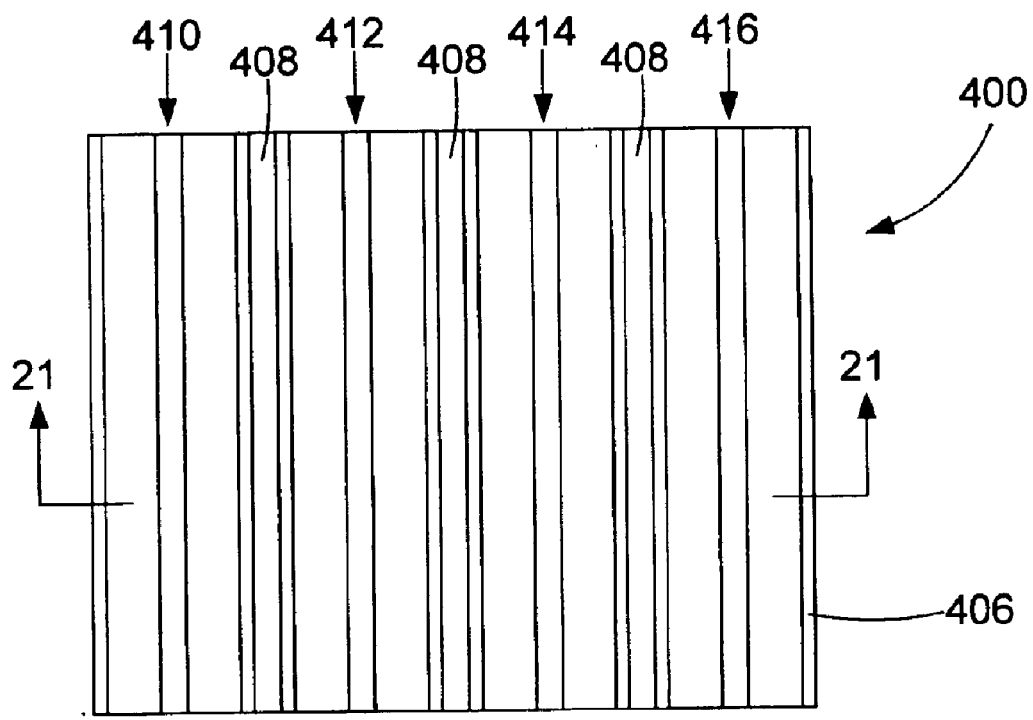
FIG. 20 is a plan view of an eighth embodiment of high-power semiconductor input/output structure in accordance with the present inversion.
Figure 21:
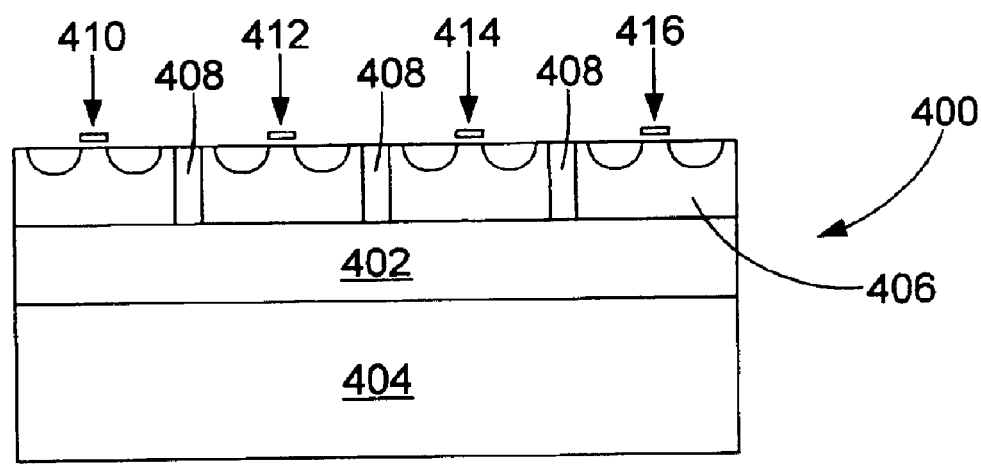
FIG. 21 is a sectional view taken along the line 21—21 of FIG. 20.

FIGS. 20 and 21 show a high-powered semiconductor input/output SOI structure 400 in accordance with the present invention. Again, the structure 400 includes an oxide layer 402 on a silicon substrate 404, the oxide layer 402 having a silicon layer 406 thereon. Formed in the silicon layer 406, and properly isolated by silicon trench isolation oxide 408, are (reading from left to right) ESD-protection N channel transistor 410, P channel transistor 412, ESD-protection N channel transistor 414, and P channel transistor 416. These transistors 410–416 are in successive side-by-side, laterally spaced relation as shown (EPEP).

Figure 22:
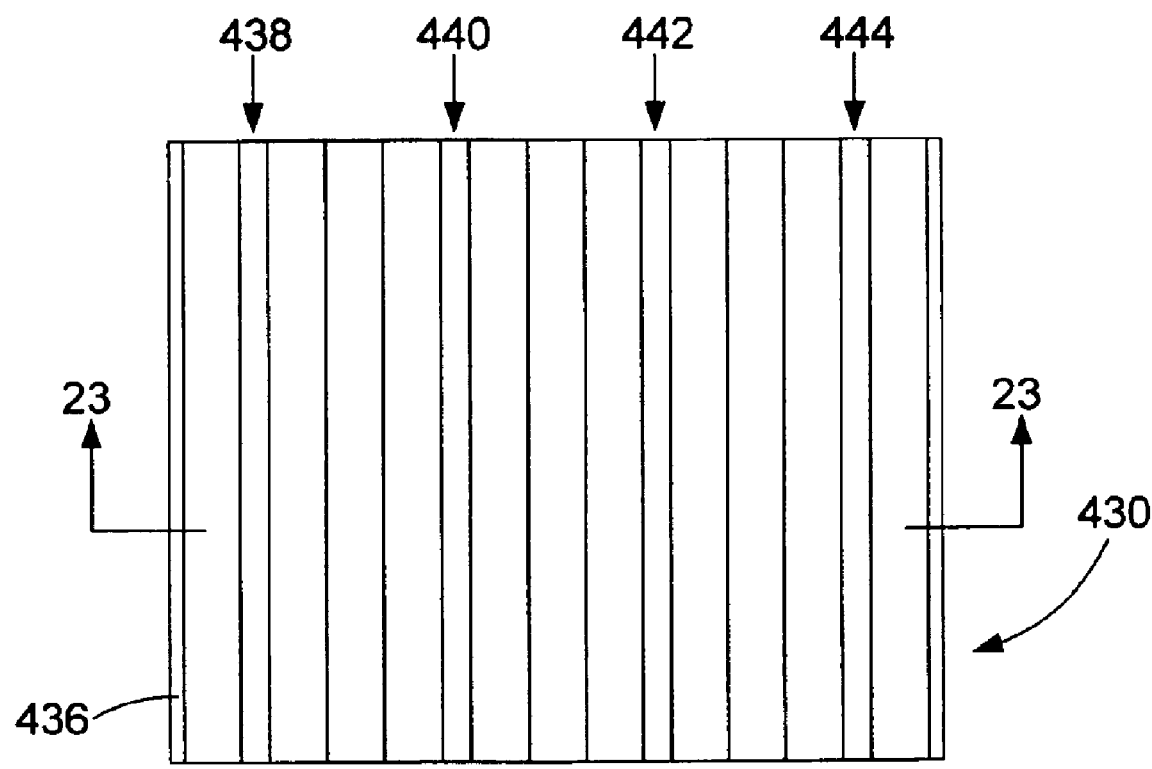
FIG. 22 is a plan view of a ninth embodiment of high-power semiconductor input/output structure in accordance with the present invention.
Figure 23:
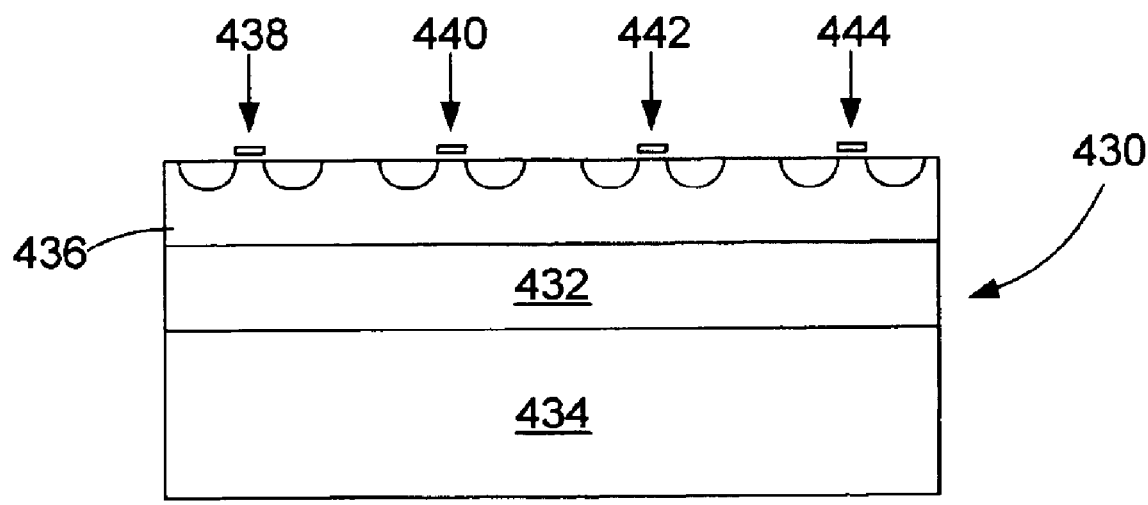
FIG. 23 is a sectional view taken along the line 23—23 of FIG. 22.

FIGS. 22 and 23 show another high-power semiconductor input/output SOI structure 430 in accordance with the present invention. Again, the structure 430 includes an oxide layer 432 on a silicon substrate 434, the oxide layer having a silicon layer 436 thereon. Formed in the silicon layer 436 are (reading from left to right) N channel transistor 438, ESD-protection N channel transistor 440, N channel transistor 442, and ESD-protection N channel transistor 444. These transistors 438–444 are in successive side-by-side, laterally spaced relation as shown (NENE).

It will be seen that structure 400 has the transistors thereof reversed in lateral left to right order from the order of structure 300, and structure 430 has the transistors thereof reversed in lateral left to right order from the order of structure 330.

Figure 24:
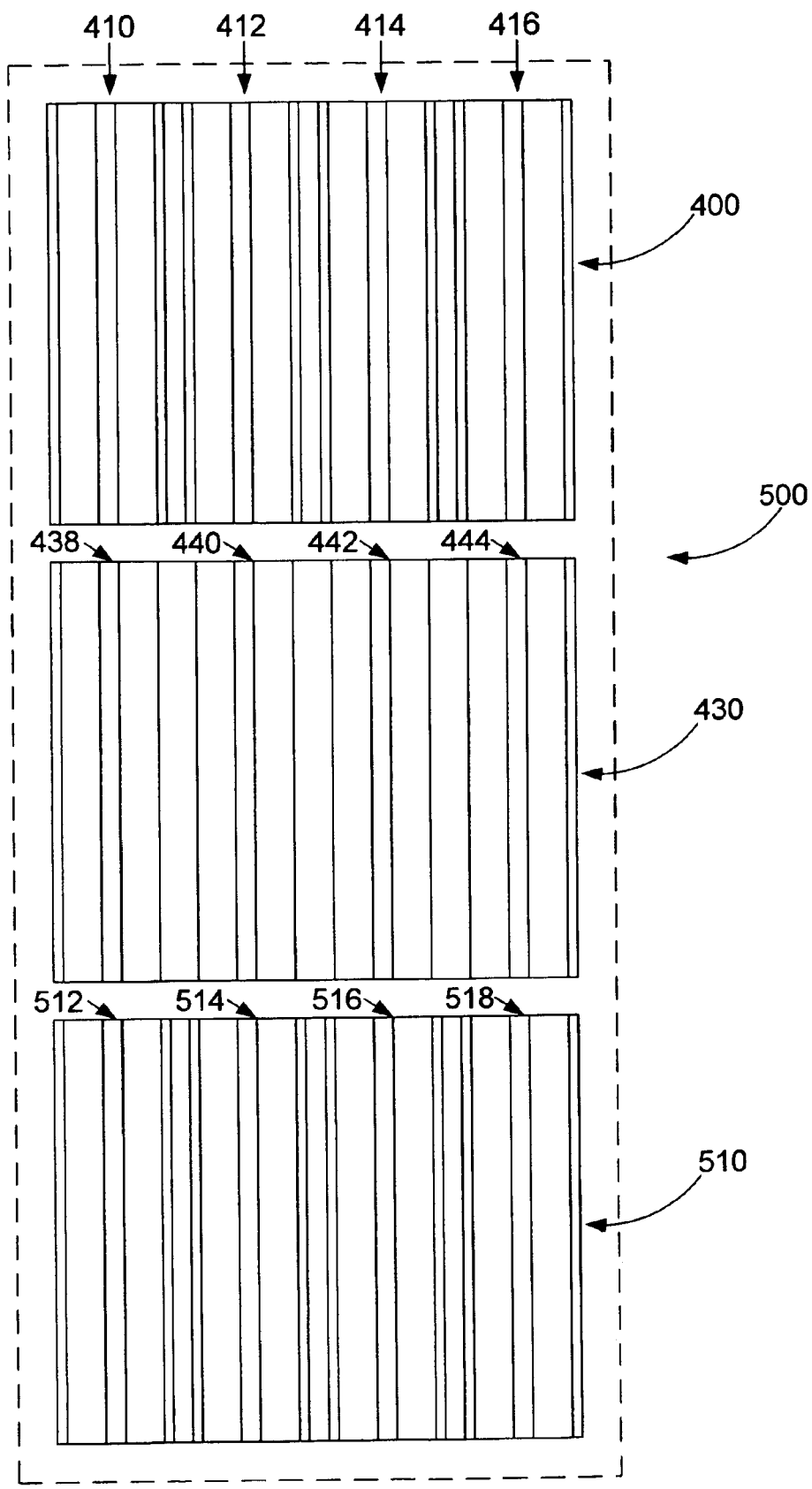
FIG. 24 is a plan view illustrating a second cell of the present invention.

FIG. 24 shows a cell 500 (a mirror image of cell 360, FIG. 19) made up of the structures of FIGS. 20–23. In this cell 500, the structure 400 and the structure 430 immediately therebelow are separated by silicon trench isolation oxide 350 and are positioned so that transistors 410, 438 are adjacent and substantially aligned, transistors 412, 440 are adjacent and substantially aligned, transistors 414, 442 are adjacent and substantially aligned, and transistors 416, 444 are adjacent and substantially aligned. The structure 510 immediacy below the structure 430 is a repeat of the structure 400, so that transistors 438, 512 are adjacent and substantially aligned, transistors 440, 514 are adjacent and substantially aligned, transistors 442, 516 are adjacent and substantially aligned, and transistors 444, 518 are adjacent and substantially aligned.

Figure 25:
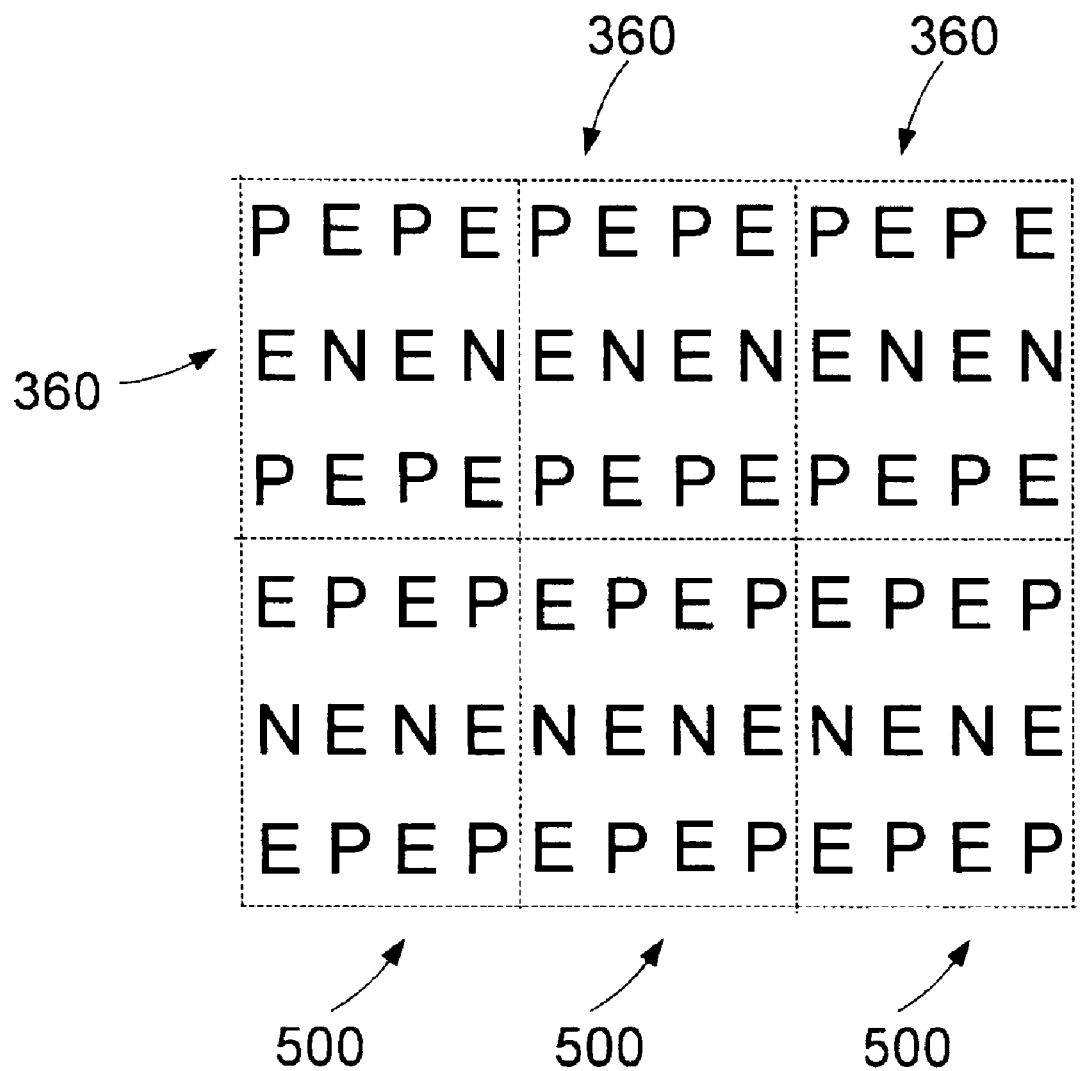
FIG. 25 is a plan view showing combinations of the cells of FIGS. 19 and 24.

FIG. 25 illustrates a layout of cells of FIGS. 19 and 24, the cells in an upper row being cell 360, cell 360, cell 360, etc., from left to right. The leftmost cell 360 in that row has immediately below it a cell 500, with the cells in this additional row (immediately below the upper row) being cell 500, cell 500, cell 500, etc., from left to right. With the pattern formed, it will be seen that each non-ESD N channel transistor has most adjacent it, in the vertical and horizontal directions, only N channel ESD-protection transistors, while each non-ESD N channel transistor has most adjacent it, in the diagonal directions, only P channel transistors.

With the cells positioned as shown in FIG. 25, again being separated by a silicon trench isolation oxide, non-ESD-protection N charnel transistors are separated in an appropriate manner to avoid heat buildup.

The foregoing description of the embodiments of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled

What is claimed is:

1. A high power semiconductor input/output SOI structure comprising first and second adjacent and substantially aligned transistors, one of the first and second transistors being an N channel transistor, the other of the first and second transistors being a P channel transistor, and further comprising third and fourth adjacent and substantially aligned transistors, the first and third transistors being in successive side-by-side, lateral relation, the second and fourth transistors being in successive side-by-side, lateral relation, one of the third and fourth transistors being an N channel transistor, the other of the third and fourth transistors being a P channel transistor, wherein the first and third transistors are P channel transistors, and the second and fourth transistors are N channel transistors, and wherein the second and fourth transistors are ESD-protection transistors.

2. A high-power semiconductor input/output SOI structure comprising first and second adjacent and substantially aligned N channel transistors, one of the transistors being an ESD-protection transistor, the other transistor being a non-ESD-protection transistor, and further comprising third and fourth adjacent and substantially aligned N channel transistors, the first and third transistors being in successive side-by-side, lateral relation, the second and fourth transistors being in successive side-by-side, lateral relation, one of the third and fourth transistors being an ESD-protection transistor, the other of the third and fourth transistors being a non-ESD-protection transistor.

3. The structure of claim 2 wherein the second and fourth transistors are ESD-protection transistors.

4. A high-power semiconductor input/output SOI structure comprising first, second and third transistors in successive side-by-side, lateral relation, the first and third transistors being N channel transistors, the second transistor being a P channel transistor, wherein the fist transistor is an ESD-protection transistor, and the third transistor is a non-ESD-protection transistor.

5. A high-power semiconductor input/output SOI structure comprising first, second and third transistors in successive side-by-side, lateral relation, the furst and third transistors being N channel transistors, the second transistor being a P channel transistor, wherein the first and third transistors are ESD/protection transistors.

6. A high-power semiconductor input/output SOI structure comprising first, second and third transistors in successive side-by-side, lateral relation, the first and third transistors being P channel transistors, the second transistor being an N channel transistor, wherein the second transistor is an ESD-protection transistor.

7. A high-power semiconductor input/output SOI structure comprising first, second and third N channel transistors in successive side-by-side, lateral relation, the second transistor being an ESD-protection transistor, the first and third transistors being non-ESD-protection transistors.

8. A high-power semiconductor input/output SOI structure comprising first, second and third N channel transistors in successive side-by-side, lateral relation, the first and third transistors being ESD-protection transistors, the second transistor being a non-ESD protection transistor.

9. A high-power semiconductor input/output SOI structure comprising:

first, second, third and fourth transistors in successive side-by-side, lateral relation, the first and third transistors being P channel transistors, the second and fourth transistors being N channel transistors;

fifth, sixth, seventh and eighth N channel transistors in successive side-by-side, lateral relation;

the first and fifth transistors being adjacent and substantially aligned;

the second and sixth transistors being adjacent and substantially aligned;

the third and seventh transistors being adjacent and substantially aligned;

the fourth and eighth transistors being adjacent and substantially aligned;

the fifth and seventh transistors being ESD-protection transistors.

10. A high-power semiconductor input/output SOI structure comprising:

first, second, third and fourth transistors in successive side-by-side, lateral relation, the first and third transistors being P channel transistors, the second and fourth transistors being N channel transistors;

fifth, sixth, seventh and eighth N channel transistors in successive side-by-side, lateral relation;

the first and fifth transistors being adjacent and substantially aligned;

the second and sixth transistors being adjacent and substantially aligned;

the third and seventh transistors being adjacent and substantially aligned;

the fourth and eighth transistors being adjacent and substantially aligned;

the second and fourth transistors being ESD-protection transistors.

11. The high-power semiconductor input/output SOI structure of claim 10 wherein the fifth and seventh transistors are ESD-protection transistors.

* * * * *